United States Patent
Young et al.

(10) Patent No.: US 9,252,773 B2
(45) Date of Patent: Feb. 2, 2016

(54) APPLICATION SPECIFIC POWER CONTROLLER CONFIGURATION TECHNIQUE

(75) Inventors: Chris M. Young, Austin, TX (US); John A. Billingsley, Groesbeck, TX (US)

(73) Assignee: Intersil Americas LLC, Milpitas, CA (US)

( * ) Notice: Subject to any disclaimer, the term of this patent is extended or adjusted under 35 U.S.C. 154(b) by 0 days.

(21) Appl. No.: 12/961,095

(22) Filed: Dec. 6, 2010

(65) Prior Publication Data

US 2011/0181351 A1    Jul. 28, 2011

Related U.S. Application Data

(60) Provisional application No. 61/298,340, filed on Jan. 26, 2010.

(51) Int. Cl.
| | |
|---|---|
| *G06F 17/50* | (2006.01) |
| *H03K 19/00* | (2006.01) |
| *H03K 19/173* | (2006.01) |
| *G06F 9/44* | (2006.01) |
| *H04L 12/24* | (2006.01) |

(52) U.S. Cl.
CPC ........ *H03K 19/0016* (2013.01); *G06F 17/5054* (2013.01); *H03K 19/1732* (2013.01); *G06F 9/4443* (2013.01); *G06F 17/5022* (2013.01); *H04L 41/0806* (2013.01)

(58) Field of Classification Search
CPC .................................................... G06F 17/50
See application file for complete search history.

(56) References Cited

U.S. PATENT DOCUMENTS

| | | | |
|---|---|---|---|
| 5,678,049 A | 10/1997 | Massie | |
| 5,744,944 A | 4/1998 | Danstrom | |

(Continued)

FOREIGN PATENT DOCUMENTS

| | | |
|---|---|---|
| CN | 1723464 | 1/2006 |
| WO | WO 2004/044952 A2 | 5/2004 |

OTHER PUBLICATIONS

"ZY2105 5A No-Bus POL Data Sheet—8V to 14V Input—0.5V to 5.5V Output—ZD-01967 REV. B1.1"; 14 pages; Power-One; 14 pages; retrieved from Internet: ic.cn/pdfs/d0e6a13ac53caa7717543ed22bdf58c9.pdf.

(Continued)

*Primary Examiner* — A. M. Thompson
(74) *Attorney, Agent, or Firm* — Meyertons Hood Kivlin Kowert & Goetzel, P.C.; Jeffrey C. Hood

(57) ABSTRACT

Configuring the operational behavior of an integrated circuit. The integrated circuit (IC) comprises a plurality of configuration inputs for configuring the IC. The IC also has a memory which stores a plurality of sets of parameter values. Each parameter value of the respective set corresponds to a different operational parameter of a plurality of operational parameters. The IC includes logic which determines a first plurality of configuration values corresponding to the first plurality of configuration inputs. The logic then selects a set of parameter values from the stored plurality of sets of parameter values. The selection of parameter values is based on the first plurality of configuration values. The IC is then configured for operation according to one or more operational parameter values in the selected set of parameter values.

14 Claims, 5 Drawing Sheets

(56) References Cited

U.S. PATENT DOCUMENTS

| | | | |
|---|---|---|---|
| 5,845,141 A | 12/1998 | Massie | |
| 6,177,785 B1 | 1/2001 | Lee | |
| 6,262,594 B1 | 7/2001 | Cheung et al. | |
| 6,366,224 B2 | 4/2002 | Cliff et al. | |
| 6,630,903 B1 | 10/2003 | Hann et al. | |
| 6,654,850 B2* | 11/2003 | Fox et al. | 711/111 |
| 6,788,483 B1 | 9/2004 | Ferris et al. | |
| 6,936,999 B2 | 8/2005 | Chapuis | |
| 6,938,235 B2 | 8/2005 | Breejen et al. | |
| 6,949,916 B2 | 9/2005 | Chapuis | |
| 7,000,125 B2 | 2/2006 | Chapuis et al. | |
| 7,049,798 B2* | 5/2006 | Chapuis et al. | 323/282 |
| 7,068,021 B2 | 6/2006 | Chapuis | |
| 7,071,664 B1 | 7/2006 | Teggatz et al. | |
| 7,239,115 B2 | 7/2007 | Chapuis et al. | |
| 7,249,267 B2 | 7/2007 | Chapuis | |
| 7,266,709 B2 | 9/2007 | Chapuis et al. | |
| 7,315,156 B2 | 1/2008 | Chapuis | |
| 7,372,682 B2 | 5/2008 | Chapuis | |
| 7,382,676 B2 | 6/2008 | Ballweber et al. | |
| 7,394,445 B2 | 7/2008 | Chapuis et al. | |
| 7,449,872 B2 | 11/2008 | Zolfaghari | |
| 7,456,617 B2 | 11/2008 | Chapuis et al. | |
| 7,459,892 B2 | 12/2008 | Chapuis | |
| 7,554,778 B2 | 6/2009 | Chapuis | |
| 7,565,559 B2 | 7/2009 | Chapuis | |
| 7,583,487 B2 | 9/2009 | Chapuis | |
| 7,587,292 B2* | 9/2009 | Rathei | 702/108 |
| 7,589,584 B1 | 9/2009 | Bui | |
| 7,602,260 B1 | 10/2009 | Atesoglu | |
| 7,619,402 B1 | 11/2009 | Kwong | |
| 7,646,382 B2 | 1/2010 | Chapuis et al. | |
| 7,714,610 B2* | 5/2010 | He | 326/41 |
| 7,917,873 B1* | 3/2011 | Canfield et al. | 716/104 |
| 8,127,261 B2* | 2/2012 | Auerbach et al. | 716/107 |
| 8,769,477 B1* | 7/2014 | Gathoo et al. | 716/139 |
| 2002/0174293 A1* | 11/2002 | Fox et al. | 711/111 |
| 2004/0103346 A1* | 5/2004 | Dietz et al. | 714/25 |
| 2008/0048715 A1 | 2/2008 | Balasubramanian et al. | |
| 2008/0061822 A1 | 3/2008 | Balasubramanian et al. | |
| 2008/0094101 A1 | 4/2008 | Balasubramanian et al. | |
| 2008/0127065 A1* | 5/2008 | Bryant et al. | 717/109 |
| 2009/0128186 A1 | 5/2009 | Balasubramanian et al. | |
| 2010/0001760 A1 | 1/2010 | Balasubramanian et al. | |
| 2010/0188117 A1* | 7/2010 | Street et al. | 326/38 |

OTHER PUBLICATIONS

"Pin Programmable Universal and Bandpass Filters: MAX263/MAX264/MAX267/MAX268"; Maxim Integrated Products; 2008; 28 pages; Sunnyvale, CA, USA; retrieved from Internet: http://datasheets.maxim-ic.com/en/ds/MAX263-MAX268.pdf.

"Low Noise, 90 MHz Variable-Gain Amplifier AD603"; 1995; 16 pages; Analog Devices, Inc.; Norwood, MA, USA.

"MOS Integrated Circuit µPD720114 ECOUSB Series USB 2.0 HUB Controller Data Sheet"; Nov. 2005; 32 pages; NEC Electronics Corporation; Japan; retrieved from Internet: http://www.datasheetcatalog.org/datasheets2/30/307636_1.pdf.

"L5953 Multiple Switching Voltage Regulator Product Preview"; Sep. 2003; STMicroelectronics; retrieved from Internet: http://www.datasheetcatalog.org/datasheet2/1/02c2erclj04akk69iwzl3f01jkky.pdf.

"AMS1082 10A Low Dropout Voltage Regulators"; 8 pages; Advanced Monolithic Systems, Inc.; retrieved from Internet: http://www.advanced-monolithic.com/pdf/ds1082.pdf.

"LP2950/LP2951 Series of Adjustable Micropower Voltage Regulators"; Jun. 17, 2009; 26 pages; National Semiconductor.

"LTC3025 300mA Micropower VLDO Linear Regulator"; 2004; 12 pages; Linear Technology Corporation; Milpitas, CA, USA; retrieved from Internet: http://cds.linear.com/docs/Datasheet/3025fd.pdf.

* cited by examiner

FIG. 3a

| Device Part Number | Model CFG0 | Rail CFG1 |
|---|---|---|
| XMPL_4 | 10k | H/O/L |
| XMPL_9 | 11k | H/O/L |
| XMPL_16 | 12.1k | H/O/L |
| XMPL_25 | 13.3k | H/O/L |
| XMPL_45 | 14.7k | H/O/L |
| XMPL_100 | 16.2k | H/O/L |
| XMPL_150 | 17.6k | H/O/L |
| XMPL_25T | 19.6k | H/O/L |
| XMPL_45T | 21.5k | H/O/L |
| XMPL_100T | 23.7k | H/O/L |
| XMPL_150T | 26.1k | H/O/L |

| | XMPL_4 | XMPL_9 | XMPL_16 | XMPL_25 | XMPL_45 | XMPL_100 | XMPL_150 | XMPL_25T | XMPL_45T | XMPL_100T | XMPL_150T |
|---|---|---|---|---|---|---|---|---|---|---|---|
| Output Voltage | | | | | | | | | | | |
| Over/under voltage limit | | | | | | | | | | | |
| Over/under current limit | | | | | | | | | | | |
| Ramp up/down times | | | | | | | | | | | |
| Delay on/off | | | | | | | | | | | |
| Switching Frequency | | | | | | | | | | | |
| Current Sense Calibration Mode | | | | | | | | | | | |
| Compensation | | | | | | | | | | | |
| Temperature Sense Mode | | | | | | | | | | | |

352    354

| Voltage | CFG0 | Voltage | CFG1 | Current | CFG2 | Current | CFG3 | Current | CFG4 |
|---------|------|---------|------|---------|------|---------|------|---------|------|
| 0 | 10k | 0 | 10k | 0 | 10k | 0 | 10k | 10 | 10k |
| 0.05 | 11k | 1 | 11k | 0.05 | 11k | 1 | 11k | 20 | 11k |
| 0.1 | 12.1k | 2 | 12.1k | 0.1 | 12.1k | 2 | 12.1k | 30 | 12.1k |
| 0.15 | 13.3k | 3 | 13.3k | 0.15 | 13.3k | 3 | 13.3k | 40 | 13.3k |
| 0.2 | 14.7k | 4 | 14.7k | 0.2 | 14.7k | 4 | 14.7k | 50 | 14.7k |
| 0.25 | 16.2k | 5 | 16.2k | 0.25 | 16.2k | 5 | 16.2k | 60 | 16.2k |
| 0.3 | 17.6k | | | 0.3 | 17.6k | 6 | 17.6k | 70 | 17.6k |
| 0.35 | 19.6k | | | 0.35 | 19.6k | 7 | 19.6k | 80 | 19.6k |
| 0.4 | 21.5k | | | 0.4 | 21.5k | 8 | 21.5k | 90 | 21.5k |
| 0.45 | 23.7k | | | 0.45 | 23.7k | 9 | 23.7k | 100 | 23.7k |
| 0.5 | 26.1k | | | 0.5 | 26.1k | | | 110 | 26.1k |
| 0.55 | . | | | 0.55 | . | | | 120 | . |
| 0.6 | . | | | 0.6 | . | | | 130 | . |
| 0.65 | . | | | 0.65 | . | | | 140 | . |
| 0.7 | . | | | 0.7 | . | | | 150 | . |
| 0.75 | . | | | 0.75 | . | | | 160 | . |
| 0.8 | . | | | 0.8 | . | | | 170 | . |
| 0.85 | . | | | 0.85 | . | | | 180 | . |
| 0.9 | . | | | 0.9 | . | | | 190 | . |
| 0.95 | . | | | 0.95 | . | | | 200 | . |

FIG. 4

APPLICATION SPECIFIC POWER CONTROLLER CONFIGURATION TECHNIQUE

PRIORITY CLAIM

This application claims benefit of priority of U.S. provisional patent application Ser. No. 61/298,340 titled "Application Specific Power Controller" filed on Jan. 26, 2010, whose inventors are Chris M. Young and John A. Billingsley, and which is hereby incorporated by reference as though fully and completely set forth herein.

FIELD OF THE INVENTION

This invention relates to a system and method for configuring an electronic device. More specifically, it relates to configuring an electronic device according to one or more operational parameters.

BRIEF DESCRIPTION OF THE DRAWINGS

A better understanding of embodiments of the present invention can be obtained when the following detailed description of the preferred embodiment is considered in conjunction with the following drawings, in which:

FIG. 3a is a table illustrating exemplary configuration options according to one embodiment;

FIG. 3b is a table illustrating exemplary sets of configuration information that may be stored in one embodiment;

FIG. 4 is a table illustrating exemplary configuration options according to one embodiment.

Figure 1:
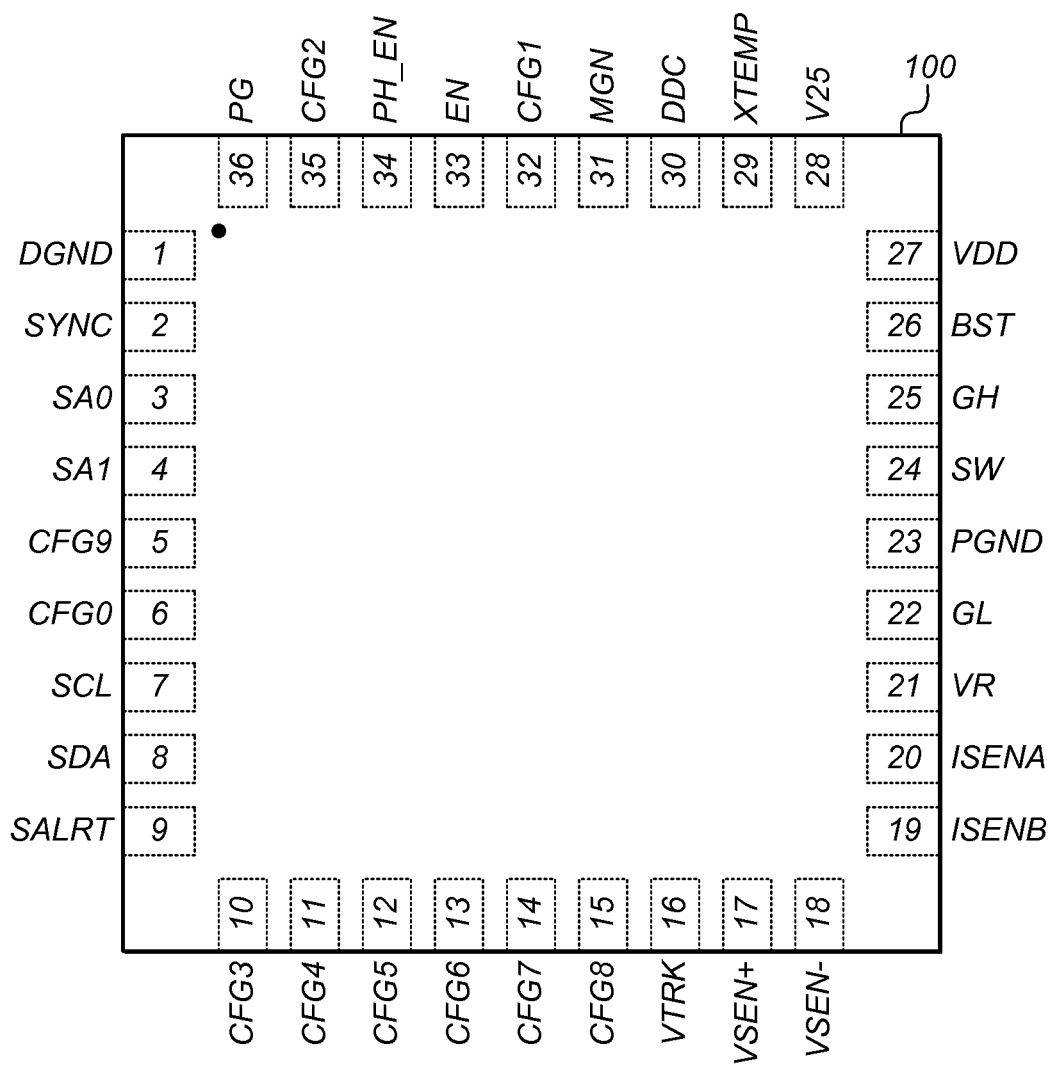
FIG. 1 depicts a packaged device with configuration pins according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

In the following description, numerous specific details are set forth to provide a thorough understanding of embodiments of the present invention. However, one having ordinary skill in the art should recognize that embodiments of the invention may be practiced without these specific details.

The category of electronic devices known as application specific power controllers (ASPCs) may be used in a wide variety of electronic circuits. Through configuration, a single ASPC design may be used in wide variety of systems. The configuration of an ASPC may involve specifying the device's behavior according to a significant number (e.g., 12, 26, 35, etc.) of operational parameters. This configuration may be commonly achieved by tying configuration inputs of the device to a high or low voltage in accordance with configuration guidelines provided by the manufacturer of the device. Depending on the options provided to a user (e.g., the number of operational parameters that may be controlled, the number of sets of configuration data) the number of configuration pins may be significant (e.g., 5, 10, 14) and the task of configuration may be complicated. Also, it may not be possible to place a configurable device in every workable configuration because of various scheme limitations (e.g. too many configuration pins may be required, circuitry connected to the configuration pins may not be able to decode every workable configuration, or corresponding configuration settings may not be stored on the device). Embodiments of the present invention described herein may, in contrast, provide the following benefits. Embodiments may provide users with an easy way to configure a device (e.g., an ASPC) and/or may allow one device to fit many designs and/or may reduce the amount of technical support required from the manufacturer of the device.

FIG. 1

FIG. 1 depicts a packaged electronic device 100 that may support some embodiments of the invention. Packaged electronic device 100 may be of various types (e.g., a digital logic device, an analog device, a mixed signal device, a power device, an ASPC). Device 100 is depicted with 36 pins arranged around the periphery of the package. Depicted pins may include power supply pins (e.g., pin 27 VDD, pin 1 DGND) and functional pins (e.g., pin 7 SCL, pin 8 SDA). Packaged device 102 may also include one or more pins that may be used to configure the operation of the device (e.g., operation during a functional mode). For example, device pins may include one or more dedicated configuration pins (e.g., pins whose sole function may be to configure the device). For example, depicted device 100 may have ten dedicated configuration pins (e.g., pins CFG0-CGF9). Configuration pins may be used to configure the device through connections made to the configuration pins. Detection circuitry on the electronic device may be able to determine the configuration state of each configuration pin. The configuration state of a pin may be set by connections made to the pin. For example, the pin may be left open circuit, connected to a supply rail, connected to ground, connected to a supply rail using a resistor or connected to ground using a resistor. The value of the resistor may be used to specify a particular pin state and a set of allowable resistor values may be specified for each pin. So, for example, device 100 may be designed so that pin CFG1 may work with a resistor value of 10 kohm or 16.2 kohm but not with a resistor value of 26.1 kohm. The pin states of multiple configuration pins (e.g., taken together, taken in sub-groups) may be used to select one or more parametric configuration values.

Packaged electronic device 100 may integrated into a system, and, during integration, one or more of configuration pins (e.g., CFG0-CFG9) may be connected (e.g., using a specified value of resistor) to a specified supply rail. For example, pin 6, CFG0 may be connected using a 10 k ohm resistor to a 1.2V supply rail and pin 32, CFG1, may be connected to ground. Some configuration pins (e.g., CFG2-CFG9) may be unused and the connections to used configuration pins (e.g., CFG0-1) may be used to configure device behavior according to a number (e.g., one, two, three, five, twenty, thirty-one, etc.) of operational parameters. Some embodiments may use non-dedicated pins to configure the behavior of the device; these non-dedicated pins may be connected using resistors to a supply rail and the pins may be observed during a monitoring period (e.g., during device reset). During an operational period (e.g., after a monitoring period) these non-dedicated configuration pins may be used for other functional uses.

In some embodiments, one or more groups of configuration pins may be used in combination to select multiple parametric configuration values (e.g., a set or group of parameters). For example, in some embodiments (e.g., in an ASPC), a group of configuration pins (e.g., pins CFG0-2) may be used (e.g., together and in combination) to select configuration values (e.g., one or more configuration value per operational parameter) for a set of operational parameters (e.g., output voltage, compensation and on/off delay). Certain embodiments may also use other configuration pins (e.g., pins CFG 5-6) to select other configuration values for another set of operational parameters (e.g., ramp up/down times, switching frequency). In some embodiments, multiple configuration pins may be used (e.g., together and in combination) to select one or more configuration values for a single operational parameter (e.g., pins CGF8-9 may be used to select two configuration values corresponding to a "current limit" operational parameter). Typically, after integration a utilized configuration pin may be connected to voltage source through a resistor (e.g., to ground through a resistor, to a supply rail through a resistor). However, a configuration state may be communicated in other ways (e.g., by tying a configuration pin directly to a rail, by leaving a configuration pin unconnected, driving a configuration pin using circuitry).

FIG. 2

Figure 2:
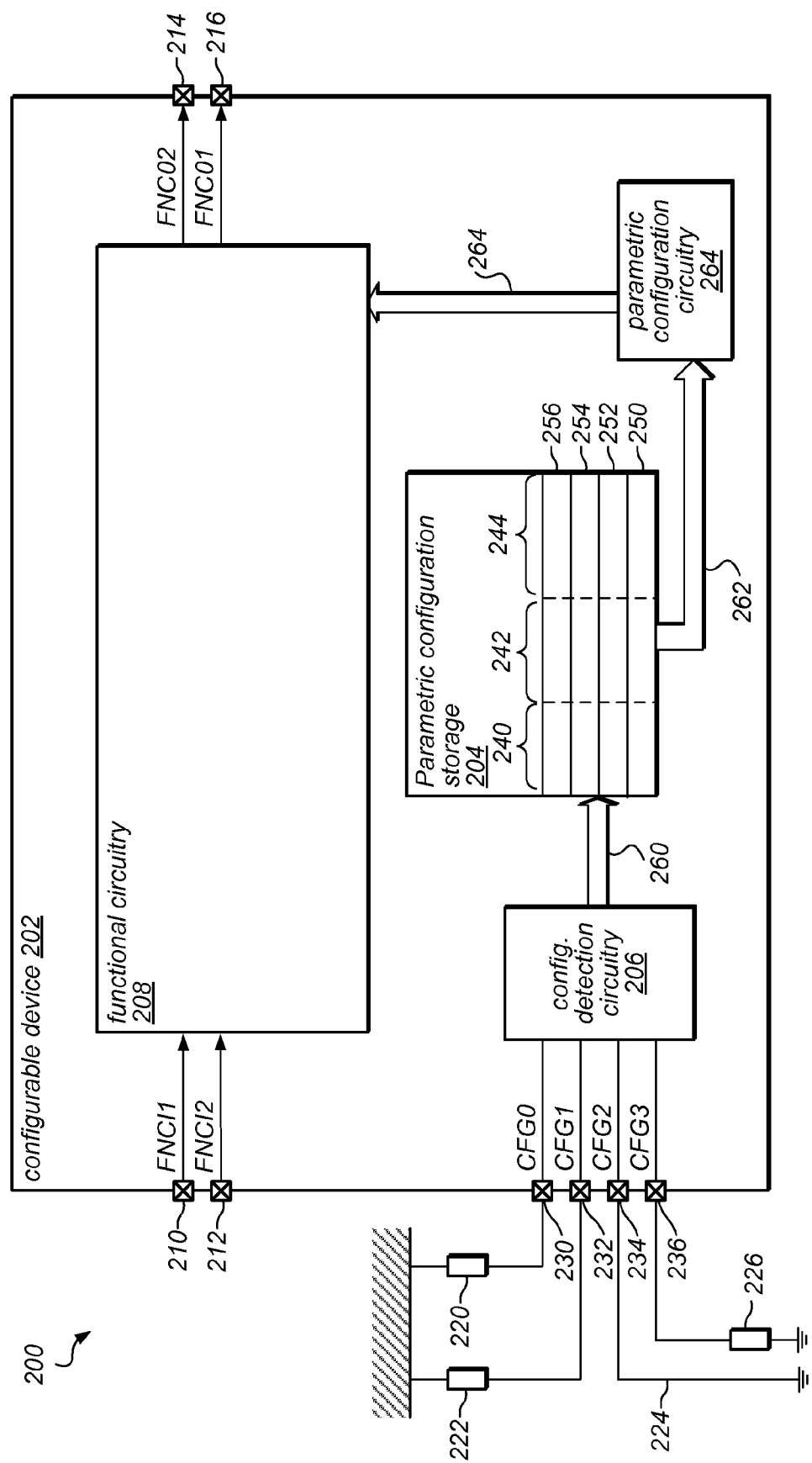
FIG. 2 depicts an exemplary integrated circuit according to one embodiment.

FIG. 2 shows an exemplary electronic circuit 200 according to some embodiments. Electronic circuit 200 depicts a configurable device 202 that may include functional input pins (FNCI1 210, FNCI2 212), functional output pins (FNCO1 214, FNCO2 216) and configuration pins (CFG0 230, CFG1 232, CFG2 234, CFG3 236). The configurable device may support one or more functions (e.g., providing a voltage supply) and these functions may be implemented within functional circuitry 208. In some embodiments, functional circuitry 208 may include two or more functional blocks (not depicted). Functional circuitry 208 may be coupled to the one or more functional input pins (e.g., FNCI1, FNCI2) and may also be coupled to one or more functional output pins (e.g., FUNCO1, FNCO2). Functional circuitry 208 may be configured according to one or more operational parameters and such parametric configurations may affect how functional circuitry 208 behaves in response to inputs provided on coupled functional input pins and such configurations may also affect how functional circuitry 208 drives coupled functional output pins.

Configuration pins (CFG0-3) may be connected in circuit 200 in accordance with guidelines (e.g., guidelines provided by the company supplying configurable device 202). A design engineer using configurable device 202, being familiar with the guidelines for configuration of configurable device 202 and also being aware of the particular use of circuit 200, may connect the configuration pins of device 202 in order to properly configure device 202 for an intended use. For example, in the depicted circuit 200, configuration pin CFG0 230 may connect to a supply rail through resistor 220, configuration pin CFG1 232 may connect to the same supply rail through resistor 222, configuration pin CFG2 234 may directly connect to ground and configuration pin CFG3 236 may connect to also connect to ground, but may do so through resistor 226. The choice of resistor value for each resistor 220, 222 and 226 may be made in accordance with the guidelines and the intended use of configurable device.

Configurable device 202 may also include configuration detection circuitry 206 that may determine the configuration states of configuration pins (e.g., the configuration state of each configuration pin being utilized). For example, the configuration detection circuitry 206 may be able to determine the value of a resistor (e.g., resistor 220, resistor 222, resistor 226) connected to a configuration pin (e.g., pins 230, 232 and 236) and/or it may be able to determine if a configuration pin is tied to a power rail and/or it may be able to determine if a configuration pin is left unconnected. In some embodiments, the configuration detection circuitry may be able to determine which resistor (e.g., from a pin-specific enumerated list of resistor values) is attached to a specific configuration pin. The configuration circuitry may monitor one or more configuration pins in a variety of ways (e.g., monitor continuously, monitor during a configuration period) to determine the configuration state of each of the one or more configuration pins. Also, in some embodiments, the configuration detection circuitry may operate dynamically (e.g., detect configuration settings continuously, detect changes to configuration settings) or it may operate statically (e.g., detect configuration settings once after device power-on, detect configuration settings once after device reset).

Depicted configuration detection circuitry 206 may also output configuration identifier 260 that may be used to select one or more configuration values that may correspond to one or more operational parameters. In some embodiments, the value of configuration identifier (e.g., configuration identifier 260) may correspond to the combination of states of utilized configuration pins (e.g., configuration pins 230-236). In some embodiments, configuration identifier 260 may be used to select a set of configuration values from a table of configuration sets. In certain embodiments, the size (e.g., width, number of bits) of configuration identifier 260 may correspond to the number of configuration sets supported (e.g., the number of configuration sets stored in the configuration table, the maximum number of configuration sets that may be stored in the configuration table). In some embodiments, configuration detection circuitry may output multiple configuration identifiers (e.g., a first configuration identifier that may used to select a first set of parametric configuration values, a second configuration identifier that may be used to select a second set of parametric configuration values). The number of parametric configuration values (e.g., the number of configuration values in a configuration set) selected by a configuration identifier may vary (e.g., from embodiment to embodiment) and may be independent of the number of configuration pins or the range of supported resistor values. In one embodiment, for example, two configuration pins, each supporting four resistor values, may be used to select sixteen sets of parametric configuration values. The number of parameters configured in each set of configuration values may vary widely (e.g., the number of parameters may range from one to the total number of operational parameters of the configurable device).

As depicted in FIG. 2, some embodiments may include parametric configuration storage (PCS) 204 that may hold parametric configuration values. PCS 204 may be implemented in various ways (e.g., as Flash memory, as read-only memory (ROM), as non-volatile random-access memory (NVRAM), as field programmable gate array (FPGA) logic, as logic). Parametric configuration values may be stored in shared storage, for example, parametric configuration values may be stored in memory that is also used for other purposes.

Parametric configuration values may be stored in PCS 204 in various ways. For example, in some embodiments, configuration values may be stored in selectable (e.g., identifiable) sets. In certain embodiments, each selectable set of parametric configuration values may contain fields, and each field may contain a configuration value corresponding to one or more operational parameters. For example, in depicted PCS 204, rows 250, 252, 254 and 256 may each represent a selectable set of parametric configuration values and columns 240, 242, 244 may represent data fields within each configuration set. For example, column 240 may represent a field corresponding to a first operational parameter, column 242 may represent a field corresponding to a second, third and fourth operational parameters and column 244 may represent a field corresponding to a fifth operational parameter. In some embodiments, a selectable set may correspond to a common configuration (e.g., a configuration used by many customers, a configuration used in many systems) or a configuration intended for a selected set of customers or a configuration intended for a specific application/system. The configuration values held in PCS 204 may configure all operational parameters, most operational parameters (more than 50% of all operational parameters) or some operational parameters. Operational parameters that may not be configured using information held in PCS 204 may be configured by other or similar means.

The configuration values held in PCS 204 may be programmed in various ways. For example, in some embodiments, parametric configuration values may be programmed by various parties (e.g., a configurable device supplier, a configurable device manufacturer, a configurable device user) to meet various needs (e.g., market needs, product needs, system needs, customer needs). This programming may be performed at various stages (e.g., during device manufacture, after manufacturing, after packaging, after shipment, after integration, after use). Programming and/or reprogramming of PCS 204 may be accomplished in various ways (e.g., by downloading configuration values through a communications port on configurable device 202, by setting values in a ROM or NVRAM during device manufacturing, by downloading values through a test interface, by configuring circuitry during design, by blowing fuses).

Parametric configuration values held in PCS 204 may be updated. Updating parametric configuration values may involve, for example, replacing existing configuration values and/or augmenting existing configuration values. For example, an update may expand the number of configuration sets from eight to sixteen and may replace three configuration sets of the original eight. Following an update, a wider or narrower range of resistor values may be supported on one or more configuration pins (configuration detection circuitry may be designed to support a range of resistor values that is a superset of the resistor values supported at any given time). Following an update, one or more configuration identifiers may be able to select a narrower or wider range of parametric configuration values (e.g., more or less configuration sets, configuration values corresponding to a greater or fewer number of parameters) than was supported prior to the update.

Configurable device 202 may also comprise parametric configuration circuitry (PCC) 264. The PCC 264 may be coupled to the parametric configuration storage 204 as shown, and may also be coupled to receive configuration identifier 260 (or may otherwise be coupled to the configuration detection circuitry 206). In the depicted embodiment, parametric configuration values, that may be selected from PCS 204, (e.g., by using configuration identifier 260) may be supplied (e.g., by bus 262) to PCC 264. PCC 264 may use the supplied configuration information to appropriately configure the operation of configurable device 202. In certain embodiments, PCC 264 may process the supplied configuration information (e.g., decode, decompress, rationalize, partition, combine, encode) before performing the configuration. The parametric configuration may be performed in various ways (e.g., using configuration information directly, without additional processing of configuration information, after additional processing of configuration information, using configuration information indirectly). For example, in the depicted embodiment, configuration may be performed by sending configuration inputs 264 to functional circuitry 208. Functional circuitry 208 may include configurable circuitry whose operational behavior is controlled by configuration values placed on configuration inputs 264.

In FIG. 2, PCC 264 is depicted as a discrete block but the circuitry of PCC 264 may be implemented in various ways. For example, in some embodiments, each function (or sub-function) within configurable device 202 (e.g., within functional circuitry 208) that may be subject to parametric configuration may have some localized parametric configuration circuitry. Consequently, in some embodiments, the circuitry described as PCC 264 may be distributed (e.g., fully distributed, partially distributed) throughout functional circuitry 208.

FIGS. 3a and 3b

FIG. 3a depicts, for certain embodiments, the relationship between the supported configurations of a configurable device and the configuration states of two configuration pins of the configurable device. Column 304 holds configurable device part numbers, each of which may correspond to a specific set of supported parametric configurations. Column 306 holds various resistor values that, when connected appropriately to pin CFG0, may be used to select a supported configuration set (e.g., to select a configuration set that corresponds to a corresponding part number). Column 308 indicates that for each resistor selection made for pin CFG0, the CFG1 pin may be tied high, left open-circuit, or tied low. In some embodiments, the configuration settings for CFG1 (e.g., tied high, low or left open) in conjunction with the configuration settings for CFG0 (e.g., resistor selection and connection) may be used, together, to configure the device for operation. For example, the configurable device may be an ASPC and configuration pin CFG1 may be used to specify the output voltage provided by the ASPC (e.g., tying CFG1 high may specify an output voltage of 1.2V, leaving CFG1 open circuit may specify an output voltage of 1.1V and tying CFG1 low may specify an output voltage of 0.9V). In a similar fashion, CFG1 may be used to select a set of parametric configuration values corresponding to a specific part number. For example, a 21.5 kilohm resistor may be appropriately connected to pin CFG0, and, in response, the ASPC may be configured using a configuration set corresponding to configuration set identifier XMPL_45T.

FIG. 3b depicts the logical organization of parametric configuration information that may be stored on a configurable device, in accordance with some embodiments. As depicted in table 350, parametric configuration values may be stored in sets (e.g., sets of predetermined configuration values, sets of compatible configuration values, sets of configuration values that are determined to be suitable for certain applications, sets of configuration values that are determined to be suitable for certain products, sets of configuration values that correspond to specific device part numbers). Column 352 of table 350 shows the names of exemplary operational parameters that may have configuration values stored in a set. In depicted table 350, each column of columns 354 may hold a configuration set and each configuration set may correspond to a specific device part number (e.g., a device part number from column 304 of table 300) or any other standard application (e.g., 12 Volts input, 2.5 Volts output, 20 Amps output, 400 kHz switching frequency). In some embodiments, a configuration set (held in one of the columns 354) may be selected by connecting (e.g., to pin CFG0 of a configurable device) a resistor of a value chosen from column 306. For example, the configuration set in column XMPL_45 of table 350 may be selected by suitably connecting a resistor (or resistors) of value 14.7 kohm. In some embodiments, a number of parametric configuration sets (e.g., as depicted in table 350) may be stored in a configurable device (e.g., in PCS 204) and a specific configuration set may be selected (e.g., configuration set XMPL_4) in response to the configuration state of one or more configuration pins (e.g., configuration pin CFG0 being connected to a 10 kilohm resistor).

FIG. 4

FIG. 4 depicts configuration table 400 that illustrates, for one or more embodiments, the relationship between operational settings (for two parameters) and corresponding configuration resistor values. For example, a value taken from column 402, in combination with a value taken from column 406, may indicate a supported output voltage setting (e.g., a voltage level that may be driven by an output on a configurable device, a supported configurable output setting). In depicted table 400, column 406 shows supported integer voltages (e.g., in volts) and column 402 shows supported fractional voltages (e.g., in volts). In some embodiments, an associated output on the embodiment may be driven to a voltage level that corresponds to the addition of a selected integer voltage value and a selected fractional voltage value. For example, if the value 0.45 is selected from column 402 and the value 3 is selected from column 406 the associated output may be driven to a voltage of 3.45 volts. Similarly, if 0.9 is selected from column 402 and 1 is selected from column 406 the associated output may be driven to a voltage of 1.9 volts.

Column 404 enumerates resistor values that may be connected to configuration pin CFG0 in order to select a corresponding voltage value from column 402. Similarly, column 408 enumerates resistor values that may be connected to configuration pin CFG1 in order to select a corresponding voltage value from column 406. According to depicted configuration table 400, an embodiment (e.g., a configurable device) may be configured to drive an output voltage of 3.25V by connecting a 13.3 kilohm resistor to pin CFG1 and by connecting a 16.2 kilohm resistor to pin CFG0. In some embodiments, as illustrated by table 400, the configuration states of two pins may be used (e.g., together, and in combination) to determine the value of an operational parameter (e.g., output voltage).

Just as columns 402-408 may describe (or specify) configuration settings associated with an output voltage, so columns 410-420 may describe (or specify) configuration settings associated with an output current. In depicted configuration table 400, column 410 enumerates fractional output current values (e.g., values in fractions of a mA) and column 412 specifies, for each current value in column 410, the corresponding resistor (e.g., resistor value) that may be connected to configuration pin CFG2 to select the fractional current value. Similarly, column 414 enumerates integer output current values (e.g., in mA) and column 416 specifies, for each current value in column 414, the corresponding resistor (e.g., resistor value) that may be connected to configuration pin CFG3 to select the integer current value. Likewise, column 418 enumerates output current values (in tens of units) and column 420 specifies, for each current value in column 418, the corresponding resistor that may be connected to configuration pin CFG4 to select the current value (in tens of units). Thus, according to the depicted configuration table 400, an embodiment (e.g., a configurable device) may be configured to drive an output current of 105.35 mA through the following selections and connections; a resistor of 19.6 kilohm may be connected to pin CFG2 (e.g., to select 0.35 mA), a resistor value of 16.2 kilohm may be connected to pin CFG3 (e.g., to select 5 mA) and a resistor value of 23.7 kilohm may be connected to pin CFG4 (e.g., to select 100 mA). Thus, table 400 illustrates that, in some embodiments, the states of three configuration pins may be used (e.g., together, and in combination) to determine the value of an operational parameter (e.g., output current).

In some embodiments, a configurable device (e.g., configurable device 202) may hold (e.g., in PCS 204) programmed parametric configuration information (e.g., similar to data that may be held in depicted table 350). The configurable device may be configured (e.g., for operational purposes, for test purposes) through one or more configuration pins (e.g., pins 230-236). Configuration detection circuitry (e.g., circuitry 206) on the configurable device may detect the state of the one or more configuration pins (e.g., determine, for one or more configuration pins, the value of an attached resistor, determine the voltage on one or more configuration pins) and thus identify (e.g. from a table containing multiple sets of configuration values, from a table similar to table 400), a set of configuration values (e.g., values corresponding to 0.3V, 1V, 0.05 mA, 3 mA and 50 mA) that may be used to configure the operation of the configurable device, according to one or more parameters (e.g., output voltage and output current).

FIG. 5

Figure 5:
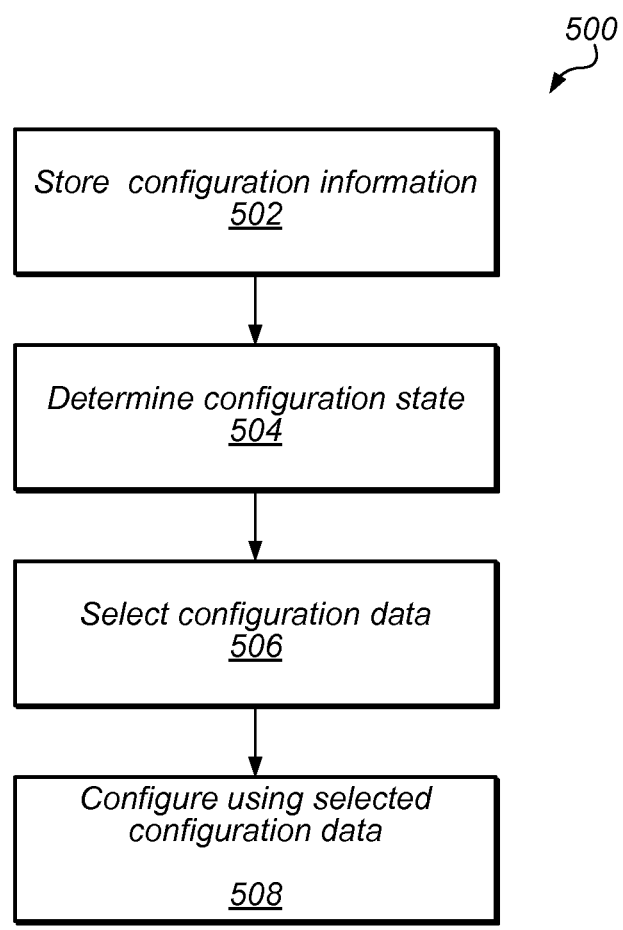
FIG. 5 is a flowchart illustrating a method for configuring a device according to one embodiment.

FIG. 5 is a flowchart that depicts an exemplary method 500 for configuring a device according to some embodiments.

In 502 configuration information may be stored on the configurable device. Configuration information may be of various types, formats, encodings and organizations. Configuration data may be used to configure various aspects of device operation (e.g., operation associated with various parameters). Configuring may include controlling (e.g., enabling/disabling/limiting) functional behavior, controlling performance (e.g., increasing frequency, response time, sample rates), controlling parametric behavior (e.g., voltage levels, controlling interfaces. Multiple, selectable sets (groups) of configuration data may be stored.

Configuration information may be stored by programming the device, e.g., more specifically by storing the configuration information in a memory medium on the integrated circuit, such as parametric configuration storage 204 in FIG. 2. Storing the configuration information in 502 may be performed in various ways, e.g., by downloading data through an interface, by programming non-volatile memory, by storing data in a device memory during manufacturing, by configuring device logic, etc. Storing configuration data may involve storing additional configuration data, over-writing a portion of configuration data previously stored, updating one or more configuration values. In some embodiments, storing configuration data may allow the device to be configured in a way not previously supported. Configuration data may be organized and stored in various fashions, for example, configuration information may be organized (and selectable) according to individual configuration parameters. Configuration information may also be organized and selectable according to groups (or sets) of configuration parameters. Multiple sets of configuration data may be loaded on a single configurable device. Configurable devices may be similar except for the stored configuration information and consequently one of these similar devices may be able to operate and function in a system where another similar device may not. The configuration information stored may correspond to certain numerical values of parameters (e.g., "10" mV, "0.25" mA) but the information itself may be stored in one or more formats suitable for supplying to configuration circuitry (e.g., 3b101, 0xF).

In 504 the configuration state of device (e.g., the state of a device's configuration pins) may be determined. Step 504 may be performed by configuration detection circuitry 206, or other logic. In certain embodiments, the configuration state may correspond to the state of one or more configuration pins of the device. The configuration pins may be dedicated pins or they may also be used for (or shared with) other functions. The determining may be performed dynamically (e.g., continuously, periodically, in response to an event, on demand) or statically (e.g., performed once, performed during a certain period, performed during device reset, performed on device power-up). The state of the one or more configuration pins may be set by electrical connections made to the pins or the characteristics of electronic components connected to the pins. For example, in some embodiments, the values of one (or more) resistors attached to a pin may determine the configuration state of the pin. Also, the configuration state of a pin may be set by leaving the pin unconnected or connecting the pin to a voltage level (e.g., ground, 1V). In some embodiments, the device may be configured to identify a resistor value or connection from a specified (e.g., enumerated) list of possible options, each of which may be supported (e.g., by configuration information stored on the device). In some embodiments, the configuration state of the device may correspond to the combination of configuration states of each respective utilized configuration pin. The configuration state of the device or information derived from the configuration state may be used to identify corresponding configuration information stored on the device.

In block 506 configuration data may be selected. Step 506 may be performed by configuration detection circuitry 206, or other logic. As previously described, some embodiments may store multiple sets of configuration data and one or more of these sets may be selected. The selection may be performed using one or more identifiers; any of which may correspond to the states of one or more configuration pins. The identifier may be used in various ways to perform the selection (e.g., the identifier may be compared against data labels or the identifier may form an index into a table). The selection may be performed in various ways. For example, the selection may be made by searching and/or table indexing and/or tag matching and/or using linked lists. In one embodiment, a single identifier may be used to select a set of configuration data that may contain information data for multiple parameters. In another embodiment, multiple identifiers may be used to select multiple data items that may be associated with one or more parameters. In some embodiments, the selected configuration information (e.g., one or more sets of configuration data) may be output (e.g., to allow the actual configuration to be performed).

In 508 the device (e.g., the integrated circuit) may be configured using selected configuration information. Configuration of the device in 508 may be performed by the parametric configuration circuitry 264 (FIG. 2), or other logic. The configuration may be performed in various ways (e.g., automatically, using selected configuration data directly, using values derived from the selected configuration data, using selected configuration data indirectly). For example, in certain embodiments, the selected configuration data may be directly forwarded to configuration circuitry and the configuration may be accomplished through the forwarding of the configuration values. In some embodiments, each of one or more portions of a selected set of configuration data (e.g., portions corresponding to respective operational parameters) may be forwarded to respective configuration circuitry. Configuration information may also be forwarded to one or more configuration blocks that may send out configuration signals or values to the functional blocks being configured in order to perform the configuration. The configuration may be performed in various fashions (e.g. regularly, irregularly, in response to an event, on power-on, on reset). Configuration circuitry may be centralized, placed locally with the function to be configured or otherwise distributed through the device.

As noted above, steps 504, 506 and 508 may be performed by logic present on the device or integrated circuit (e.g., 100 or 202). For example, in one embodiment, the integrated circuit includes configuration detection circuitry 206 (FIG. 2) which determines the configuration state of the integrated circuit in 504. The configuration detection circuitry 206 may also select the configuration data from the parametric configuration storage in 506. The integrated circuit may also include parametric configuration circuitry 264 which configures the functional circuitry 208. In another embodiment, the device includes a processor (such as a microcontroller) and memory, wherein the memory stores program instructions executable by the processor to perform steps 504, 506 and 508 (and possibly 502 as well). Thus the configuration detection circuitry 206 and the parametric configuration circuitry 264 may be implemented in any of various ways, such as discrete logic, a programmable logic array (e.g., an FPGA), or a processor and memory, or combinations thereof.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

Moreover, regarding the signals described herein, those skilled in the art will recognize that a signal can be directly transmitted from a first block to a second block, or a signal can be modified (e.g., amplified, attenuated, delayed, latched, buffered, inverted, filtered, converted from analog to digital, converted from digital to analog, or otherwise modified) between the blocks. Although the signals of the above described embodiment are characterized as transmitted from one block to the next, other embodiments of the present disclosure may include modified signals in place of such directly transmitted signals as long as the informational and/or functional aspect of the signal is transmitted between blocks. To some extent, a signal input at a second block can be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal. Furthermore, those skilled in the art will also recognize that any resistor, current and voltage values disclosed herein, and noted in the figures, are to be understood as nominal values within specified tolerance bands. For example, the actual values (resistance, voltage, etc.) may deviate from the indicated nominal values (e.g. by +/−5%, +/−10%, etc) depending on the system and the type of components used. Therefore, the nominal values may be selected to yield the desired operating results within the specified tolerance bands corresponding to those nominal values.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A method for configuring the operational behavior of an integrated circuit; wherein the integrated circuit comprises a plurality of configuration pins, the method comprising:
   storing, in the integrated circuit, a plurality of configuration sets, wherein each configuration set comprises a respective set of parameter values, wherein each parameter value of the respective set of parameter values corresponds to a different operational parameter of a plurality of operational parameters;
   determining a respective configuration state of each respective configuration pin of at least a subset of the plurality of configuration pins, wherein the respective configuration state is set by connections made to the respective configuration pin;
   selecting a configuration set from the stored plurality of configuration sets based on the determined respective configuration state of each respective configuration pin of the at least a subset of the plurality of configuration pins; and
   configuring the integrated circuit for operation according to one or more parameter values comprised in the selected configuration set.

2. The method of claim 1,
   wherein said configuring the device for operation according to the one or more parameter values comprised in the selected configuration set comprises configuring the device for operation according to each parameter value comprised in the selected configuration set.

3. The method of claim 1,
   wherein at least one configuration set corresponds to a specific application of the integrated circuit.

4. The method of claim 1,
   wherein at least one configuration set corresponds to a specific customer of the integrated circuit.

5. The method of claim 1,
   wherein a number of parameter values in at least one configuration set is larger than a number of configuration pins comprised in the plurality of configuration pins.

6. The method of claim 1,
   wherein the integrated circuit is an application specific power controller.

7. An integrated circuit configurable for specific applications, the integrated circuit comprising:
   a plurality of configuration pins;
   a memory medium comprised on the integrated circuit, and storing a plurality of configuration sets, wherein each configuration set comprises a respective set of parameter values, wherein each parameter value of the respective set of parameter values corresponds to a different operational parameter of a plurality of operational parameters;
   configuration detection circuitry coupled to the plurality of configuration pins and configured to:
      determine a respective configuration state of each respective configuration pin of at least a subset of the plurality of configuration pins, wherein the respective configuration state is set by connections made to the respective configuration pin; and
      select a configuration set from the stored plurality of configuration sets based on the determined respective configuration state of each reach respective configuration pin of the at least a subset of the plurality of configuration pins; and
   parametric configuration circuitry configured to configure the integrated circuit for operation according to one or more parameter values comprised in the selected configuration set.

8. The integrated circuit of claim 7,
   wherein the parametric configuration circuitry is configured to configure the integrated circuit for operation according to each parameter value comprised in the selected configuration set.

9. The integrated circuit of claim 7,
   wherein at least one configuration set corresponds to a specific application of the integrated circuit.

10. The integrated circuit of claim 7,
    wherein at least one configuration set corresponds to a specific customer of the integrated circuit.

11. The integrated circuit of claim 7,
    wherein a number of parameter values comprised in at least one configuration set is larger than a number of configuration pins comprised in the plurality of configuration pins.

12. The integrated circuit of claim 7,
    wherein the integrated circuit is an application specific power controller.

13. An integrated circuit configurable for specific applications, the integrated circuit comprising:
    a plurality of configuration pins;
    a memory medium comprised on the integrated circuit, and storing a plurality of configuration sets, wherein each configuration set comprises a respective set of parameter values, wherein each parameter value of the respective set of parameter values corresponds to a different operational parameter of a plurality of operational parameters;
    means for determining a respective configuration state of each respective configuration pin of at least a subset of the plurality of configuration pins, wherein the respective configuration state is set by connections made to the respective configuration pin;
    means for selecting a configuration set from the stored plurality of configuration sets based on the determined respective configuration state of each respective configuration pin of the at least a subset of the plurality of configuration pins; and
    means for configuring the integrated circuit for operation according to one or more parameter values comprised in the selected configuration set.

14. A device configurable for specific applications, the device comprising:
    a plurality of configuration pins;
    a memory medium comprised on the device, and storing a plurality of configuration sets, wherein each configuration set comprises a respective set of parameter values, wherein each parameter value of respective set of parameter values corresponds to a different operational parameter of a plurality of operational parameters;
    configuration detection circuitry coupled to the plurality of configuration pins, and configured to:
       determine a respective configuration state of each respective configuration pin of at least a subset of the plurality of configuration pins; and
       select a configuration set from the stored plurality of configuration sets based on the determined respective configuration state of each respective configuration pin of the at least a subset of the plurality of configuration pins; and parametric configuration circuitry configured to configure the device for operation according to one or more parameter values comprised in the selected configuration set.

* * * * *